US009378930B2

United States Patent
Grimbergen et al.

(10) Patent No.: US 9,378,930 B2
(45) Date of Patent: Jun. 28, 2016

(54) INDUCTIVELY COUPLED PLASMA REACTOR HAVING RF PHASE CONTROL AND METHODS OF USE THEREOF

(75) Inventors: Michael N. Grimbergen, Redwood City, CA (US); Alan Hiroshi Ouye, San Mateo, CA (US); Valentin N. Todorow, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1357 days.

(21) Appl. No.: 12/717,916

(22) Filed: Mar. 4, 2010

(65) Prior Publication Data

US 2010/0224321 A1     Sep. 9, 2010

Related U.S. Application Data

(60) Provisional application No. 61/157,882, filed on Mar. 5, 2009.

(51) Int. Cl.
| | | |
|---|---|---|
| H01L 21/306 | (2006.01) | |
| C23C 16/00 | (2006.01) | |
| H01J 37/32 | (2006.01) | |
| H01L 21/67 | (2006.01) | |

(52) U.S. Cl.
CPC ......... *H01J 37/32165* (2013.01); *H01J 37/321* (2013.01); *H01L 21/67069* (2013.01)

(58) Field of Classification Search
CPC   H01J 37/321; H01J 37/3211; H01J 37/32137
USPC ....... 118/723 I, 723 IR, 723 AN; 156/345.48, 156/345.49; 315/111.51
See application file for complete search history.

(56) References Cited

U.S. PATENT DOCUMENTS

| | | | | |
|---|---|---|---|---|
| 4,143,314 | A | * | 3/1979 | Gruber ........................... 323/288 |
| 4,988,922 | A | * | 1/1991 | Shoda et al. ................... 315/223 |
| 5,556,549 | A | | 9/1996 | Patrick et al. |
| 5,580,385 | A | * | 12/1996 | Paranjpe et al. ............ 118/723 I |
| 5,665,256 | A | * | 9/1997 | Toth ............................. 219/130.21 |
| 5,935,373 | A | * | 8/1999 | Koshimizu ................ 156/345.28 |
| 6,060,329 | A | * | 5/2000 | Kamata et al. ..................... 438/9 |

(Continued)

FOREIGN PATENT DOCUMENTS

| | | |
|---|---|---|
| JP | 09-326383 A | 12/1997 |
| WO | WO 2007/131057 A2 | 11/2007 |

OTHER PUBLICATIONS

International Search Report and Written Opinion mailed Oct. 5, 2010 for PCT Application No. PCT/US2010/026237.

(Continued)

*Primary Examiner* — Luz Alejandro Mulero
(74) *Attorney, Agent, or Firm* — Moser Taboada; Alan Taboada

(57) ABSTRACT

Embodiments of the present invention generally provide an inductively coupled plasma (ICP) reactor having a substrate RF bias that is capable of control of the RF phase difference between the ICP source (a first RF source) and the substrate bias (a second RF source) for plasma processing reactors used in the semiconductor industry. Control of the RF phase difference provides a powerful knob for fine process tuning. For example, control of the RF phase difference may be used to control one or more of average etch rate, etch rate uniformity, etch rate skew, critical dimension (CD) uniformity, and CD skew, CD range, self DC bias control, and chamber matching.

14 Claims, 5 Drawing Sheets

(56) References Cited

U.S. PATENT DOCUMENTS

| | | | |
|---|---|---|---|
| 6,174,450 B1 | 1/2001 | Patrick et al. | |
| 6,472,822 B1 | 10/2002 | Chen et al. | |
| 6,538,388 B2 | 3/2003 | Nakano et al. | |
| 6,804,788 B1 * | 10/2004 | Lubomirsky et al. | 713/300 |
| 6,806,437 B2 | 10/2004 | Oh | |
| 6,818,562 B2 | 11/2004 | Todorow et al. | |
| 6,875,366 B2 | 4/2005 | Sumiya et al. | |
| 7,224,329 B1 * | 5/2007 | Onozawa et al. | 345/60 |
| 7,375,038 B2 | 5/2008 | Kumar | |
| 7,435,392 B2 | 10/2008 | Oberbeck et al. | |
| 7,785,441 B2 | 8/2010 | Miyake et al. | |
| 7,967,944 B2 | 6/2011 | Shannon et al. | |
| 2001/0013504 A1 | 8/2001 | Imafuku et al. | |
| 2002/0041160 A1 | 4/2002 | Barnes et al. | |
| 2004/0035837 A1 * | 2/2004 | Mitrovic et al. | 219/121.42 |
| 2004/0226657 A1 | 11/2004 | Hoffman | |
| 2007/0247074 A1 | 10/2007 | Paterson et al. | |
| 2008/0176149 A1 | 7/2008 | Grimbergen | |
| 2008/0253052 A1 * | 10/2008 | Crewson et al. | 361/98 |
| 2008/0272089 A1 | 11/2008 | Grimbergen et al. | |
| 2009/0284156 A1 * | 11/2009 | Banna et al. | 315/111.21 |
| 2010/0141153 A1 * | 6/2010 | Recker et al. | 315/149 |

OTHER PUBLICATIONS

International Search Report and Written Opinion mailed Oct. 5, 2010 for PCT Application No. PCT/US2010/026291.

* cited by examiner

TAPPED DELAY LINE (4 - TAP EXAMPLE)

HIGH PASS/LOW PASS FILTER PHASE SHIFTER

BRIDGED-T EQUALIZER DELAY ( Z = COMPRISED OF C, L OR COMBINATION)

INDUCTIVELY COUPLED PLASMA REACTOR HAVING RF PHASE CONTROL AND METHODS OF USE THEREOF

CROSS-REFERENCE TO RELATED APPLICATIONS

This application claims benefit of U.S. provisional patent application Ser. No. 61/157,882, filed Mar. 5, 2009, which is herein incorporated by reference in its entirety. This application is also related to U.S. patent application Ser. No. 12/717,358, filed Mar. 4, 2010 now U.S. Pat. No. 8,368,308, which is herein incorporated by reference in its entirety.

FIELD

Embodiments of the present invention generally relate to semiconductor substrate processing systems and, more specifically, to semiconductor substrate processing systems that use inductively coupled plasmas.

BACKGROUND

Typically, plasma reactors use a radio frequency (RF) power source with a constant average power or voltage to excite a plasma in a vacuum chamber. Plasma reactors in which the RF power source is coupled to the process chamber inductively, also referred to as inductively coupled plasma (ICP) reactors, are widely used, for example, in silicon and metal etch applications. Most of these reactors have an additional RF generator coupled proximate the substrate in which plasma is coupled capacitively to the chamber. This additional RF generator is often referred to as a bias RF generator.

In some ICP reactors, the source RF generator and the bias RF generator may operate using a common exciter to force both generators to generate the same single frequency. Unfortunately, however, the inventors have observed that phase misalignment of the signals produced by the respective generators may cause problems during processing. For example, although current commercial ICP reactors try to align both source and bias signals to have zero phase difference, the actual phase difference is rarely, if ever, zero. In addition, variations in the actual phase between source and bias generators naturally exist, causing chamber-to-chamber variation in their respective phase differences. Such differences in phase within a chamber and between chambers affects the ability to provide consistent processing amongst otherwise identical chambers.

Therefore, the inventors have provided improved inductively coupled plasma reactors and methods of use as described herein.

SUMMARY

Embodiments of the present invention generally provide an inductively coupled plasma (ICP) reactor that is capable of control of the RF phase difference between the ICP source (a first RF source) and a substrate bias (a second RF source) for plasma processing reactors used in the semiconductor industry. Various apparatus for controlling the RF phase difference are provided herein. In addition methods of control of the RF phase difference are also provided in order to facilitate process control. For example, control of the RF phase difference may be used to control one or more of average etch rate, etch rate uniformity, etch rate skew, critical dimension (CD) uniformity, and CD skew, CD range, self DC bias ($V_{DC}$) control, and chamber matching.

In some embodiments, a plasma reactor having an adjustable RF source phase delay may include a vacuum chamber having an inductive antenna disposed proximate a ceiling of the vacuum chamber and a bias electrode disposed proximate to and beneath a substrate support surface disposed in the vacuum chamber to support a substrate to be biased during processing; a first RF source for providing a first radio frequency (RF) signal at a first frequency that is inductively coupled to the vacuum chamber via the inductive antenna; a second RF source for providing a second RF signal at the first frequency to the bias electrode; and a phase delay controller to control the phase delay between the first RF source and the second RF source.

In some embodiments, a plasma etching reactor having an adjustable RF source phase delay may include a vacuum chamber having an inductive antenna disposed proximate a ceiling of the vacuum chamber and a bias electrode disposed proximate to and beneath a substrate support surface disposed in the vacuum chamber to support a substrate to be biased during processing; a first RF source for providing a first radio frequency (RF) signal at a first frequency that is inductively coupled to the vacuum chamber via the inductive antenna; a second RF source for providing a second RF signal at the first frequency to the bias electrode and coupled to the first RF source via a common exciter link; a phase delay controller to control the phase delay between the first RF source and the second RF source; and a controller to control the operation of the components of the plasma etching reactor.

Other and further embodiments are provided in the detailed description, below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

The above figures may be simplified for ease of understanding and are not drawn to scale.

DETAILED DESCRIPTION

Embodiments of the present invention generally provide an inductively coupled plasma (ICP) reactor that is capable of control of the RF phase difference between the ICP source (a first RF source) and a substrate RF bias (a second RF source) for plasma processing reactors used in the semiconductor industry. In addition, methods of control of the RF phase difference are also provided in order to facilitate process control. For example, control of the RF phase difference may be used to control one or more of average etch rate, etch rate uniformity, etch rate skew, critical dimension (CD) uniformity, and CD skew, CD range, self DC bias ($V_{DC}$) control, peak RF bias ($V_p$), and chamber matching.

The inventors have observed that, because the ICP loop antenna is not truly electrically small, the currents in the loop and resulting electric fields in the chamber are not symmetric. The inventors have further observed that the addition of the various vector components can produce a field pattern that is not perfectly symmetric as a result. The inventors have discovered that, by changing the phase of the ICP loop current with respect to the bias RF, the resulting field pattern can be effectively rotated. This then changes some field components, while leaving other systematic field components unchanged. The resulting etch pattern is produced by all the components. Because various small asymmetries exist in a practical etch system, changing the phase can counteract the effect of some of these asymmetries, resulting in a more uniform etch pattern.

Figure 1:
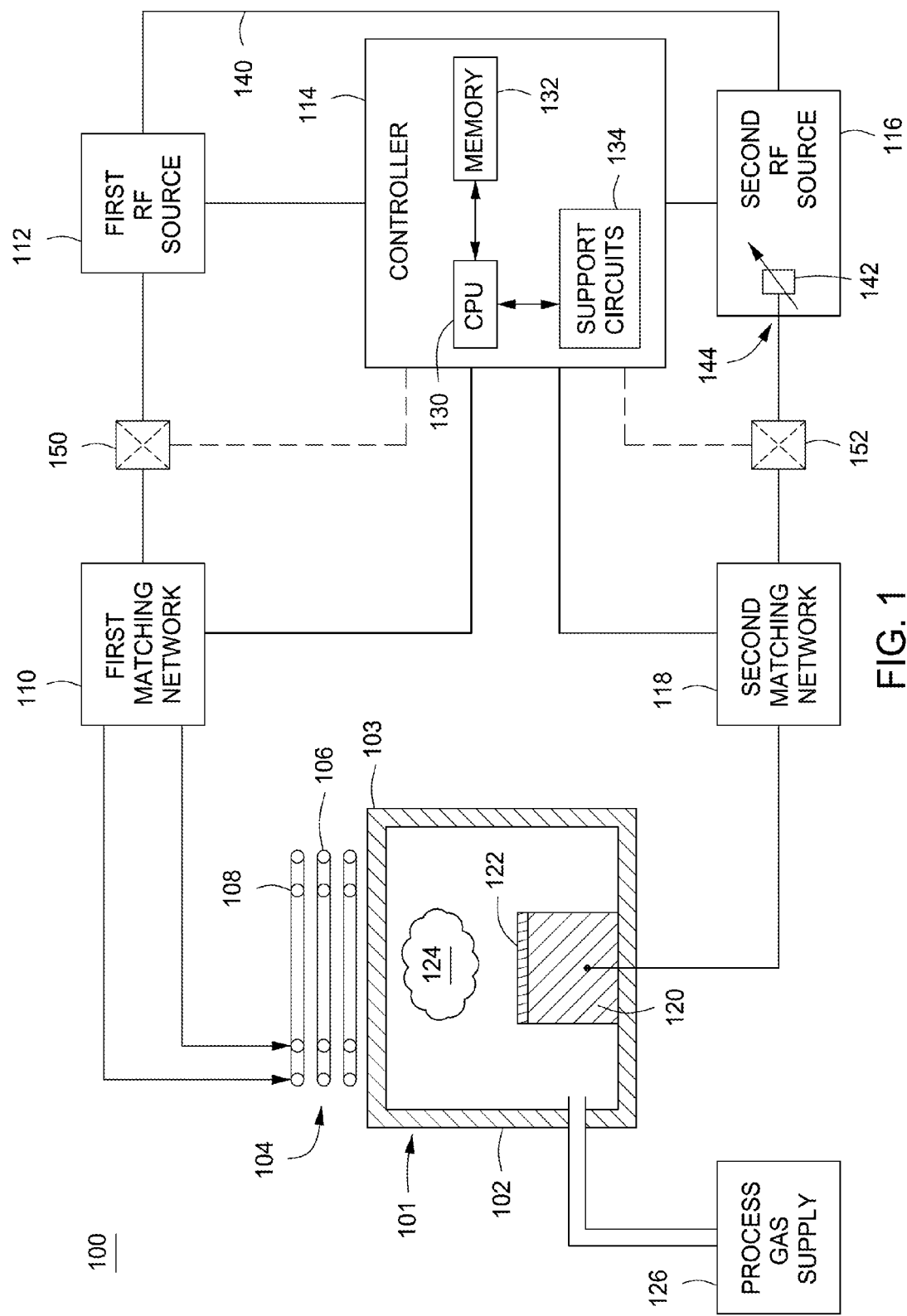
FIG. 1 is a schematic diagram of an inductively coupled plasma (ICP) reactor in accordance with some embodiments of the present invention.

FIG. 1 is an illustrative inductively coupled plasma (ICP) reactor 100 that in one embodiment is used for etching semiconductor wafers 122 (or other substrates and workpieces, such as photomasks). Other ICP reactors having other configurations may also be suitably modified and/or utilized, in accordance with the teachings provided herein. Alternatively, the exemplary ICP reactor disclosed in FIG. 1 may be modified with portions of other ICP reactors. Examples of ICP reactors that may be modified in accordance with the teachings disclosed herein include any of the TETRA™ or DPS® line of plasma reactors available from Applied Materials, Inc., of Santa Clara, Calif.

Although the disclosed embodiment of the invention is described in the context of an etch reactor and process, the invention is applicable to any form of plasma process that uses inductively coupled RF power and an RF bias source having the same frequency. Such reactors include plasma annealing reactors; plasma enhanced chemical vapor deposition reactors, physical vapor deposition reactors, plasma cleaning reactors, and the like. In addition, as noted above, the principles discussed herein may also be used to advantage in plasma reactors having capacitively coupled RF source generators.

This illustrative reactor 100 comprises a vacuum chamber 101, a process gas supply 126, a controller 114, a first RF power source 112, a second RF power source 116, a first matching network 110, and a second matching network 118.

The vacuum chamber 101 comprises a body 102 that contains a cathode pedestal 120 that forms a pedestal or support for the substrate 122. The roof or lid 103 of the process chamber has at least one antenna assembly 104 proximate the roof 103. The antenna assembly 104, in one embodiment of the invention, comprises a pair of antennas 106 and 108. Other embodiments of the invention may use one or more antennas or may use and electrode in lieu of an antenna to couple RF energy to a plasma. In this particular illustrative embodiment, the antennas 106 and 108 inductively couple energy to the process gas or gases supplied by the process gas supply 126 to the interior of the body 102. The RF energy supplied by the antennas 106 and 108 is inductively coupled to the process gases to form a plasma 124 in a reaction zone above the substrate 122. The reactive gases will etch the materials on the substrate 122.

In some embodiments, the power to the antenna assembly 104 ignites the plasma 124 and power coupled to the cathode pedestal 120 controls the plasma 124. As such, RF energy is coupled to both the antenna assembly 104 and the cathode pedestal 120. The first RF power source 112 supplies energy to a first matching network 110 that then couples energy to the antenna assembly 104. Similarly, a second RF power source 116 couples energy to a second matching network 118 that couples energy to the cathode pedestal 120. A controller 114 controls the timing of activating and deactivating the RF power sources 112 and 116 as well as tuning the first and second matching networks 110 and 118. The power coupled to the antenna assembly 104 known as the source power and the power coupled to the cathode pedestal 120 is known as the bias power. In embodiments of the invention, either the source power, the bias power, or both can be operated in either a continuous wave (CW) mode or a pulsed mode. In some embodiments, such as is used in the TETRA™ line of processing chambers, the frequency applied is 13.56 MHz. It is contemplated that other frequencies may be used as well.

In some embodiments, a common exciter link 140 (also referred to as a CEX cable or a trigger cable) may be provided to couple the first and second RF sources 112, 116 to facilitate usage of a single RF frequency generated by one of the RF sources (the master) to be utilized by the other RF generator (the slave). Either RF source may be the lead, or master, RF generator, while the other generator follows, or is the slave. In some embodiments, the first RF source 112 is the master and the second RF source 116 is the slave. The first and second RF sources 112, 116 thus may provide respective signals having the same RF frequency (as they are generated from a single source—the master generator). However, the respective signals will be offset in time, or phase, by some intrinsic amount. This is referred to herein as the intrinsic phase difference between the signals.

In an RF etch system with two powered sources at a single frequency (or less commonly, two frequencies in which one is a harmonic), the phase between the two at the chamber is determined by a number of factors. For example, the relative phase of the two sources in the chamber can be determined by the relative phase output of the two RF generators and the RF cable length difference between each generator and the chamber. Because the propagation delay in coaxial cable is of the order of 1.55 nanosecond/foot (depending on the insulator dielectric properties), changing the one of the cable lengths can predictably change the relative phase. If one of the generators is synchronized to the other by a low-power trigger signal, than changing the length of this trigger cable also can be used to change the phase. In addition, delaying the trigger signal with a delay line or programmable delay can also control the relative phase. In a non-limiting example, for a 13.56 MHz signal, the period is 73.7 nanoseconds.

In some embodiments, the intrinsic phase difference between the first and second RF sources 112, 116 may be adjusted or controlled by changing the length of the common exciter link 140. For example, the phase change based upon the propagation delay of various cable lengths can be calculated as shown in Table 1, below. Thus, the equivalence between varying cable length and delay time to adjust phase at a fixed frequency can be established.

| Cable length (ft) | Delay Time (nsec) | Phase change (13.56 MHz period) | Phase change (degrees) |
|---|---|---|---|
| 47.5 | 73.7 | 1.0 | 360 = 0 |
| 23.8 | 36.9 | 0.5 | 180 |
| 11.9 | 18.4 | 0.25 | 90 |
| 6.0 | 9.2 | 0.125 | 45 |
| 3.0 | 4.6 | 0.063 | 22 |

In some embodiments, an adjustable delay line may be used to couple the source and bias RF generators. For example, a delay circuit 142 may be provided internally (e.g., within one of the generators) or externally (e.g., between the generators) to facilitate control of the phase difference. In the embodiment illustrated in FIG. 1, the delay circuit 142 is provided in the slave RF source (the second RF source 116). The delay circuit 142 can comprise passive components, such as a variable delay line, or active components such as a programmable digital delay. The delay circuit may provide for a zero to 360 degree delay in the signal provided to the output 144 of the slave RF source, thereby facilitating control of the phase difference of the respective signals (e.g., the phase difference between the first and second RF source may be controlled or varied from the starting point of the intrinsic phase difference between the two RF sources through any increment up to and including 360 degrees). Thus, the first and second RF sources 112, 116 may be controlled to operate in perfect synchronization, or in any desired temporal offset, or phase difference.

Optimal delay values (or phase values) for the adjustable delay line can be obtained for each chamber or for various processes performed in the particular chamber. One implementation is to create a delay circuit which is programmable and/or controllable, so that the best delay can be adjusted without hardware change. This adjustment can be made at run time or during run time, for example, as part of a process control system.

Figure 2:
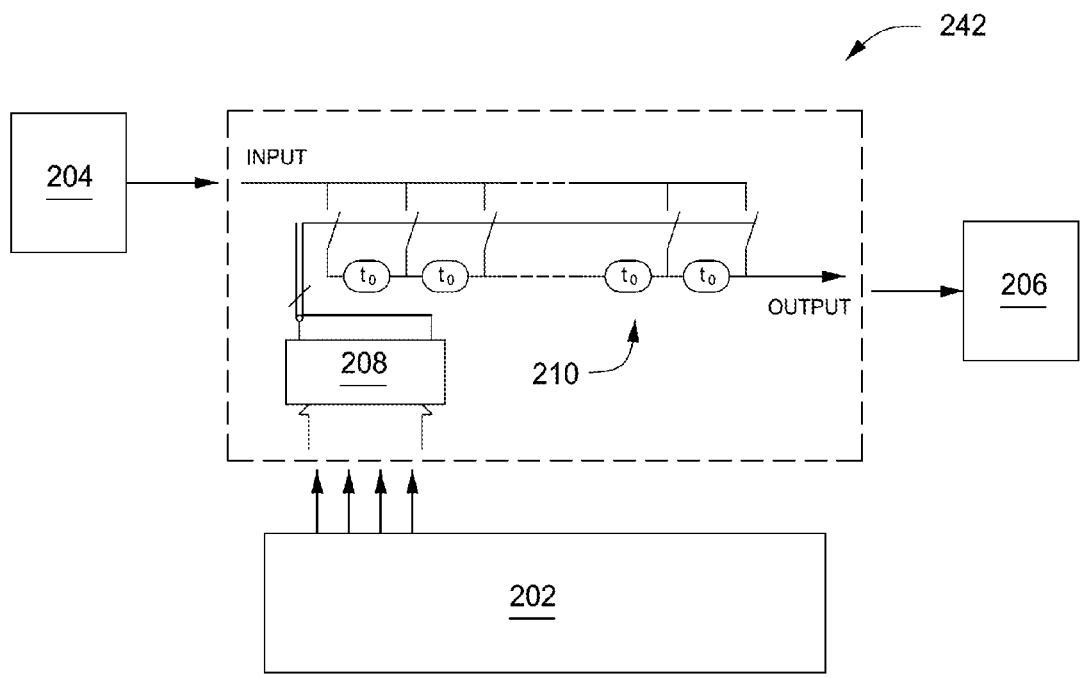
FIGS. 2-8 are schematic diagrams of phase delay controllers in accordance with some embodiments of the present invention.
Figure 3:
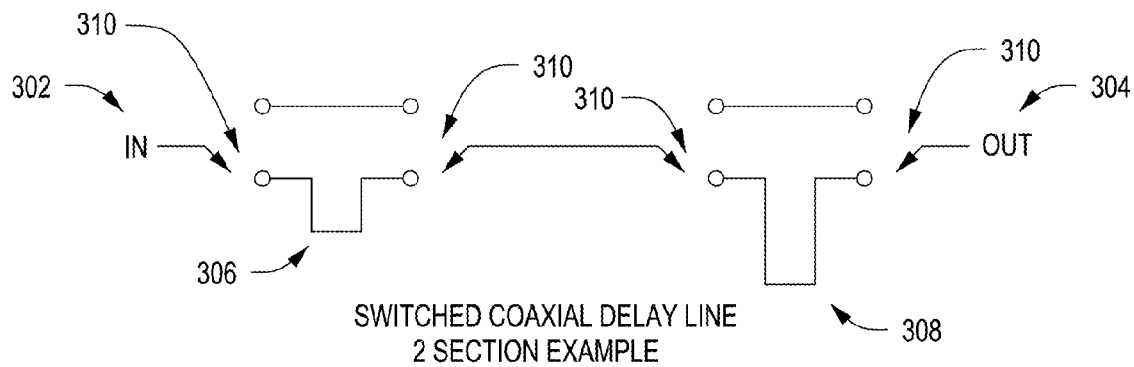

There are several methods of producing a desired delay to achieve a specific phase. For example, FIG. 2 depicts a schematic diagram of a programmable delay line in accordance with some embodiments of the present invention. For example, FIG. 2 depicts a schematic diagram of a programmable delay line integrated circuit (delay circuit 242) in accordance with some embodiments of the present invention. As shown in FIG. 2, the delay circuit 242 is programmed by an 8-bit digitized value of the desired delay time by a programming input 202. The desired delay time may be provided by the controller 114 or entered manually by an operator. The delay circuit 242 includes an internal decoder that drives 255 individual digital delay elements each having a desired delay time increment. The trigger output from the RF generator operating as the master provides the input trigger signal at the left (input 204). The internal decoder takes the 8-bit digitized delay value and switches digital logic elements to provide the total desired delay between the input from the left and the output sent to the right (output 206). The output is then conditioned to the required voltage levels needed to trigger the slave generator. As such, the trigger signal received from the input 204 is delayed by the sum of the selected individual digital delay elements to provide the signal having the desired delay to the output 206 of the delay circuit 242. The etch tool controller or operator supplies the digitized value of the delay time to reach the desired etch result In some embodiments, a coaxial cable delay box can have various lengths of coaxial cable which are switched inline by mechanical or electrical double-pole, double-throw switches. The total delay is then the sum of the lengths that have been switched inline. For example, FIG. 3 depicts an illustrative example of a switched coaxial delay line in accordance with some embodiments of the present invention. The switched coaxial delay line may be used as at least part of the delay circuit 142 shown in FIG. 1. The switched coaxial delay line includes an input 302 and an output 304 and a plurality of segments disposed therebetween (two segments 306, 308 depicted in the example of FIG. 3). A plurality of switches 310 may be provided to selectively route the RF trigger signal through zero, one, or more of the segments. Thus, the switched coaxial delay line may controllably add varying amounts of delay to the RF trigger signal traveling from the source RF generator to the bias RF generator. Each segment may be configured to provide an equal delay, or as depicted in FIG. 3, a different delay relative to each other.

Figure 4:
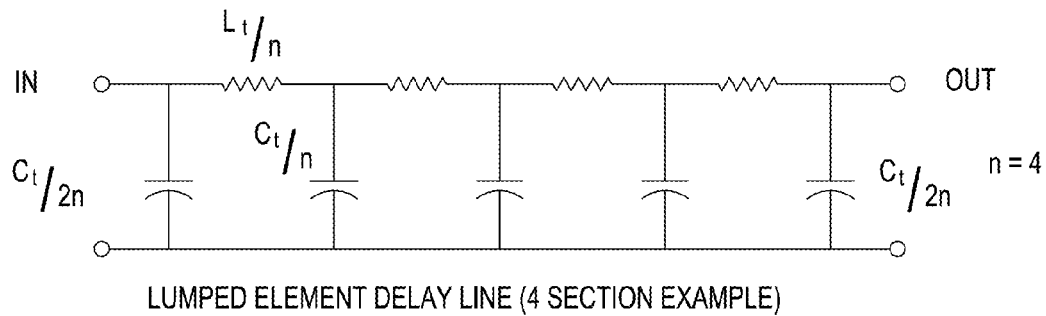
Figure 5:
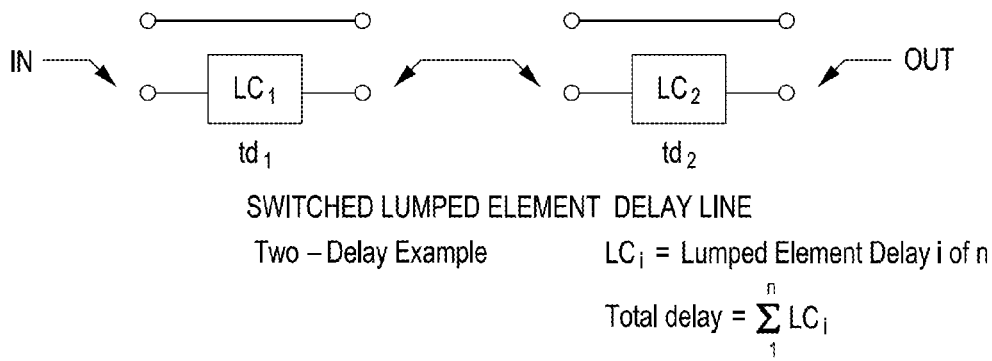

In some embodiments, lumped element circuits (typically LC sections) may be provided that are designed to have the desired delay. Each section may be switched in or out, and the total delay is the sum of the lumped element delays which have been switched in. The primary advantage of the switched lumped-element delay line is to obviate the need to house long coaxial cable lengths. For example, FIG. 4 depicts an illustrative example of a portion of a lumped element delay line (as discussed below with respect to FIG. 5) in accordance with some embodiments of the present invention. FIG. 4 depicts a four section example of a lumped element delay line comprising a plurality of inductors in series and a plurality of capacitors disposed in parallel to ground. Although four inductors and capacitors are shown, greater or fewer can be used. The total delay time for this lumped element delay line is the square root of the product of total inductance times total capacitance. As such, by selecting the values of the inductors and capacitors the desired delay time can be obtained. Moreover, as shown in FIG. 5, a plurality of lumped delay lines may be coupled together in series to form a switched lumped element delay line. The switched lumped element delay line operates similarly to the switched coaxial delay line described above, except that the segments are formed from individual lumped element delay lines. Each lumped element delay line may provide the same or different time delay. Although a two-delay example is shown in FIG. 5, greater numbers of lumped element delay lines may be switched together to provide greater flexibility and granularity of control. The switched lumped-element delay line has a number of advantages: high reliability because it does not require power or signal conditioning to function, signal fidelity, wide bandwidth, and small physical size.

Figure 6:
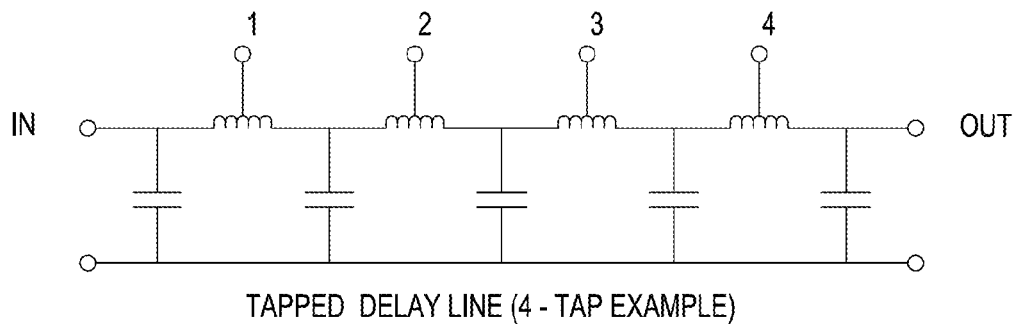

In some embodiments, an extended LC circuit may be provided with multiple taps. A different delay time is produced at each tap. One disadvantage of the tapped delay line is a limited number of taps, hence delay resolution. Another disadvantage is the fidelity of the waveform of the signal being delayed is affected by the tap configuration. FIG. 6 depicts a tapped delay line in accordance with some embodiments of the present invention.

In some embodiments, an LC or RC circuit may be provided in which one of the elements is varied to produce a varying phase delay. For example, a manual continuously adjustable ganged variable air capacitor can be used to change the phase from 0 to 360 degrees over a limited frequency range. Several circuits of this type can be employed to produce a delay, but the delay is frequency-specific, and the variable components must be calibrated at established positions to produce the desired delay.

In some embodiments, a programmable delay may be provided by an electronic circuit which digitally delays a pulse by the specified time, then is conditioned to whatever trigger level is needed by the RF generator. For example the delay can be created by counting a specific number of pulses from a higher frequency clock. While the accuracy and resolution can be very high, the programmable delay is more complex than passive devices.

Figure 7:
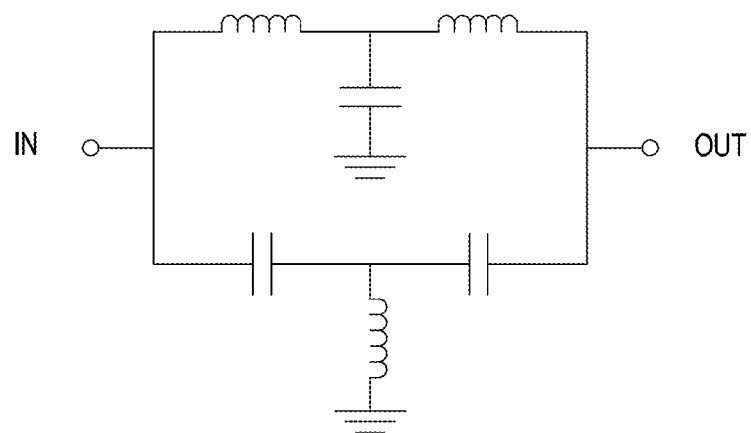

FIG. 7 depicts a high pass/low pass filter phase shifter in accordance with some embodiments of the present invention. The circuit consists of a low-pass tee in the upper branch and a parallel high-pass tee in the lower branch. The two branches each add to the total phase shift. This circuit has the advantage of providing smaller phase error than the delay line phase shifter if the frequency is changed. For those applications in which the frequency is variable, this circuit can be advantageous. For the primary etch application, however, frequency is typically well-controlled.

Figure 8:
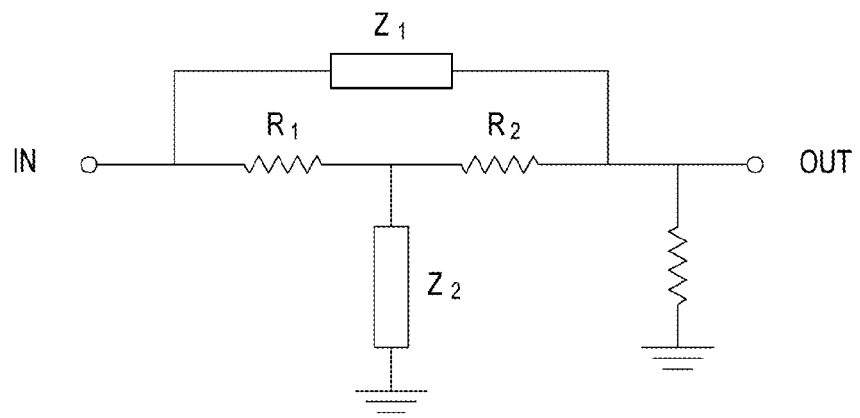

FIG. 8 depicts a bridged-T equalizer delay in accordance with some embodiments of the present invention. This circuit can be constructed with resistors and capacitors (as the Z elements), but is typically used for lower frequencies.

Returning to FIG. 1, in some embodiments, a first indicator device 150 and a second indicator device 152 may be used to determine the effectiveness of the ability of the matching networks 110, 118 to match to the plasma 124. In some embodiments, the indicator devices 150 and 152 monitor the reflective power that is reflected from the respective matching networks 110, 118. These devices can be integrated into the matching networks 110, 118, or power sources 112, 115. However, for descriptive purposes, they are shown here as being separate from the matching networks 110, 118. When reflected power is used as the indicator, the devices 150 and 152 are respectively coupled between the sources 112, 116 and the matching networks 110 and 118. To produce a signal indicative of reflected power, the devices 150 and 152 are directional couplers coupled to a RF detector such that the match effectiveness indicator signal is a voltage that represents the magnitude of the reflected power. A large reflected power is indicative of an unmatched situation. The signals produced by the devices 150 and 152 are coupled to the controller 114. In response to an indicator signal, the controller 114 produces a tuning signal (matching network control signal) that is coupled to the matching networks 110, 118. This signal is used to tune the capacitor or inductors in the matching networks 110, 118. The tuning process strives to minimize or achieve a particular level of, for example, reflected power as represented in the indicator signal.

The controller 114 comprises a central processing unit (CPU) 130, a memory 132 and support circuits 134. The controller 114 is coupled to various components of the reactor 100 to facilitate control of the etch process. The controller 114 regulates and monitors processing in the chamber via interfaces that can be broadly described as analog, digital, wire, wireless, optical, and fiber optic interfaces. To facilitate control of the chamber as described below, the CPU 130 may be one of any form of general purpose computer processor that can be used in an industrial setting for controlling various chambers and subprocessors. The memory 132 is coupled to the CPU 130. The memory 132, or a computer readable medium, may be one or more readily available memory devices such as random access memory, read only memory, floppy disk, hard disk, or any other form of digital storage either local or remote. The support circuits 134 are coupled to the CPU 130 for supporting the processor in a conventional manner. These circuits include cache, power supplies, clock circuits, input/output circuitry and related subsystems, and the like.

Process instructions, for example, etching or other process instructions, are generally stored in the memory 132 as a software routine typically known as a recipe. The software routine may also be stored and/or executed by a second CPU (not shown) that is remotely located from the hardware being controlled by the CPU 130. The software routine, when executed by CPU 130, transforms the general purpose computer into a specific purpose computer (controller) 114 that controls the system operation such as that for controlling the plasma during the etch process. Although the process of the present invention is discussed as being implemented as a software routine, some of the method steps that are disclosed therein may be performed in hardware as well as by the software controller. As such, the invention may be implemented in software as executed upon a computer system, and hardware as an application specific integrated circuit or other type of hardware implementation, or a combination of software and hardware.

Figure 9:
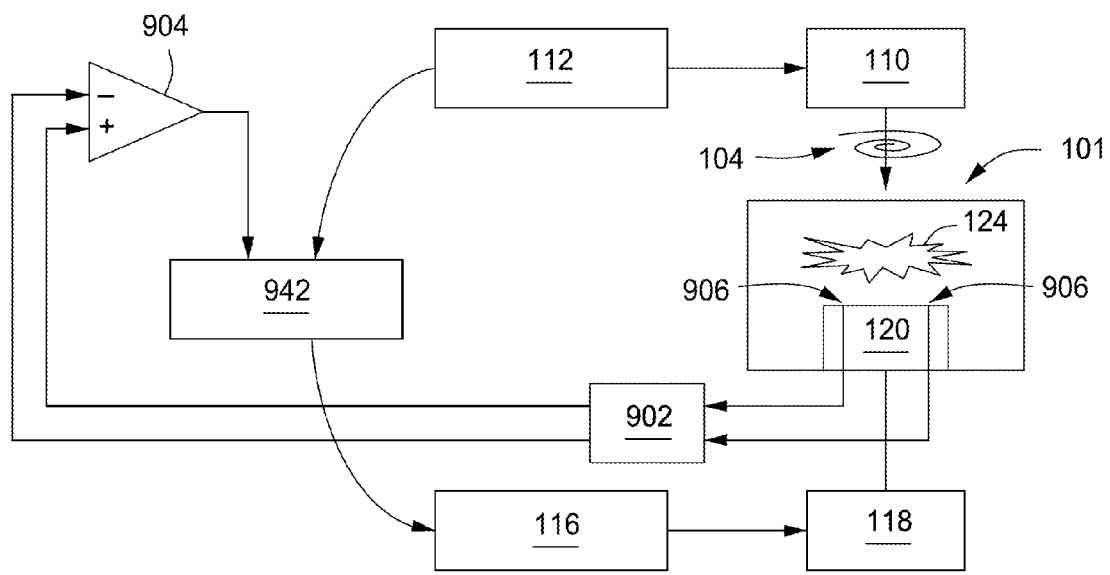
FIG. 9 is a schematic diagram of an inductively coupled plasma (ICP) reactor having feedback control in accordance with some embodiments of the present invention.

In some embodiments, multiple etch rate and/or plasma monitoring signals derived from fiber-optic sensors at different locations within the workpiece may be used to obtain data that may be used to control the phase and, thereby, to control processing within the chamber. For example, FIG. 9 depicts a schematic diagram of an inductively coupled plasma (ICP) reactor having feedback control in accordance with some embodiments of the present invention. As shown in FIG. 9, sensors located on the support pedestal 120 on either side of a photomask or wafer (e.g., substrate 122) may be used to send a differential signal to dynamically adjust the phase for best uniformity or desired etch rate in an etch chamber. A fiber optic sensor 902 may receive signals from two or more fiber optic cables 906 disposed in desired locations of the support pedestal 120 beneath the substrate. The signal from the fiber optic sensor 902 may be routed to a sensor feedback control 904 that provides a control signal to a phase delay module 942 (similar to delay circuit 142).

Figure 10:
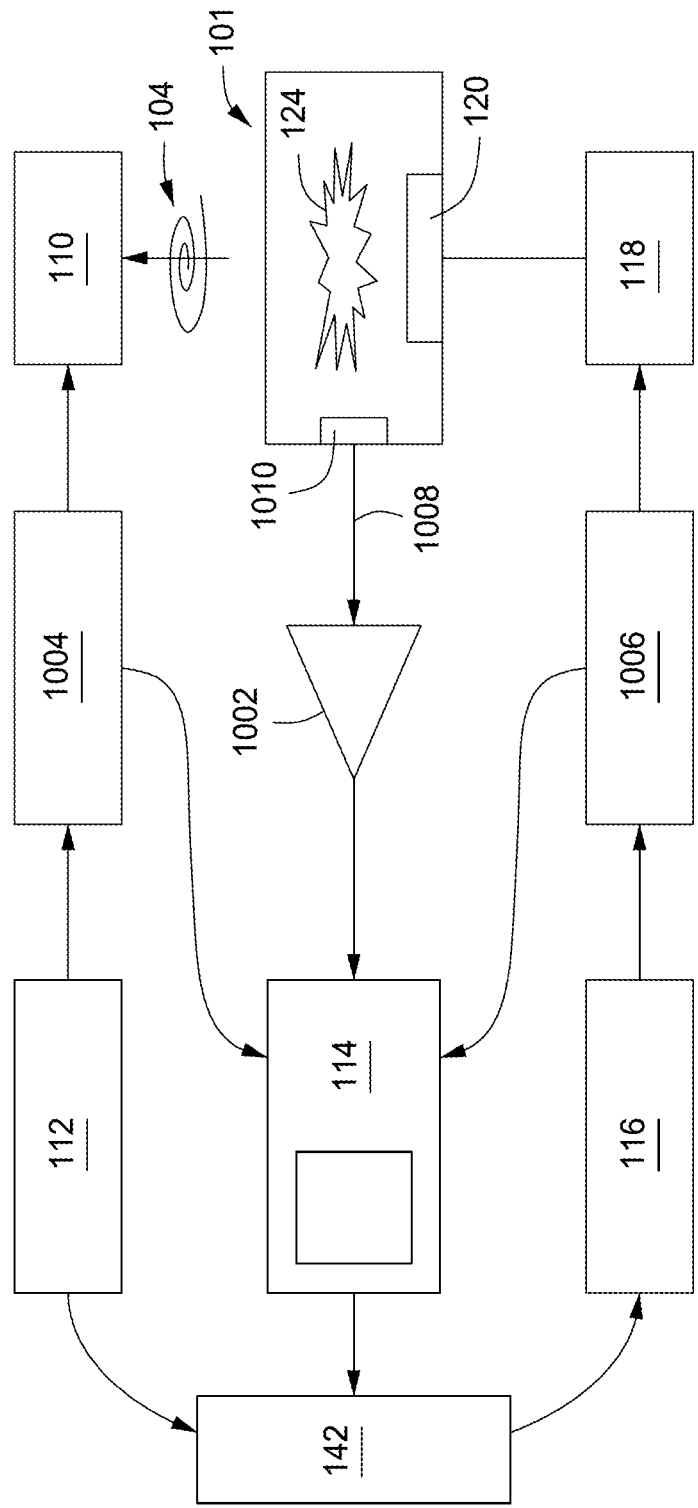
FIG. 10 is a schematic diagram of an inductively coupled plasma (ICP) reactor having feedback control in accordance with some embodiments of the present invention.

In some embodiments, the controller 114 may receive signals from a plasma monitoring device (e.g., a plasma monitor) and control the phase delay in response. For example a window 1010 may be provided in the vacuum chamber 101, as Shown in FIG. 10. A plasma monitor comprising a fast-response optical detector may be provided to detect plasma emitted radiation from within the vacuum chamber and configured to compare the phase with those of the RF generators. In some embodiments, the optical detector may provide a signal to adjust the phase of one generator relative to another. For example, a fiber optic cable 1008 may be optically coupled to the window 1010 to route signals representative of plasma emissions to the controller 114. In some embodiments, a fast amplifier 1002 may be provided to amplify the signals. In such embodiments, the controller 114 may further comprise an optical detector and analyzer for analyzing the optical signals and converting such signals to digital signals suitable for use by the controller 114 to control the phase delay circuit 142. The optical signal may be able to resolve the phase from the emission in order to provide the signal for control. The controller 142 may also be coupled to a directional coupler 1004 coupled to the output of the RF generator 112 and to a directional coupler 1006 coupled to the output of the RF generator 116 to verify the RF output of both the RF generator 112 and the RF generator 116.

The inventors have discovered that the phase difference between the source generator and the bias generator may be adjusted to minimize side-to-side etch variations and obtain the best etch uniformity. The inventors have further discovered that, in some embodiments, the phase can be adjusted by changing the length of the RF synchronizing cable (e.g., common exciter link 140) to a new length. For example, the best length has been found for the TETRA™ III chamber chromium (Cr) etch process for fabricating photomasks. This desired length was determined empirically by measuring the phase offset between existing generators, and measuring the side-to-side etch contributions for different lengths (phases). An RF cable with this specific length can then be used to couple the RF generators of the chamber to provide the desired phase difference.

In some embodiments, a semiconductor processing system may be provided having two or more similarly configured inductively coupled plasma reactors (e.g., configured similar to the inductively coupled plasma (ICP) reactor 100 described above) in a matched state. For example, a first plasma reactor may be matched with a second plasma reactor and optionally with up to N plasma reactors. Each plasma reactor may be configured similarly to the inductively coupled plasma (ICP) reactor 100 described above. Accordingly, each plasma reactor will have an intrinsic phase difference between their respective first and second RF sources (e.g., between their respective source and bias RF generators). Each intrinsic phase difference may be the same or different, but will likely be different due to the natural variation in the manufacture and assembly of the respective systems.

Thus, any one of the plasma reactors may include a vacuum chamber, a first RF source for providing a first radio frequency (RF) signal at a first frequency that is inductively coupled to the vacuum chamber (e.g., a source RF generator) and a second RF source generator for providing a second RF signal at the first frequency to an electrode disposed proximate to and beneath a substrate to be biased (e.g., a bias RF generator). The first and second RF sources of the given reactor provide respective signals having a first phase difference that is preset to match a second phase difference of a second plasma reactor to which the plasma reactor is matched.

The first phase difference may be preset by altering the intrinsic phase difference of between the first and second RF sources to match the second phase difference between the respective first and second RF sources of the second plasma reactor. The first phase difference may be altered with a delay circuit (such as the delay circuit 142 discussed above). The second phase difference of the second plasma reactor may be an intrinsic phase difference of that reactor, or may be some other phase difference to which the second plasma reactor is controlled.

In some embodiments, a central controller (not shown) may optionally be provided and configured to receive a first input representing a first intrinsic phase difference between the first and second RF sources of a first plasma reactor, and a second input representing a second intrinsic phase difference between the first and second RF sources of a second plasma reactor. The central controller is further configured to calculate a phase offset between the first intrinsic phase difference and the second intrinsic phase difference. Alternatively, the central controller may be configured to receive an input representing a phase offset, for example, that is calculated in a different controller or manually.

The central controller may be similar to controller 114 described above and may be a controller of a plasma reactor or may be a separate controller that is also coupled to the plasma reactor. The central controller may be configured to receive the first and second inputs, or the phase offset input, in any suitable manner, such as manually entering data, automated collection and input of the data inputs, or combinations thereof.

In some embodiments, the central controller is further configured to control a delay circuit in the second plasma reactor to apply the phase offset to the second intrinsic phase difference to create a phase difference that is equal to the first intrinsic phase difference. Alternatively, two or more of the plasma reactors may have respective phase offsets applied to modify their respective intrinsic phase differences to match a desired phase offset. As such, one or more (including all) plasma reactors that are to be matched may have phase differences that are matched to an existing intrinsic phase difference of any one of the plasma reactors or to some other desired phase difference.

Although the central controller is discussed above as a separate controller, each individual controller in each plasma reactor may be configured as discussed above without the need for the central controller. As such, any one or more of the capabilities of the central controller may be provided in a controller of any one or more of the plasma reactors.

While the foregoing is directed to embodiments of the present invention, other and further embodiments of the invention may be devised without departing from the basic scope thereof.

We claim:

1. A plasma reactor having an adjustable RF source phase delay, comprising:
   a vacuum chamber having an inductive antenna disposed proximate a ceiling of the vacuum chamber and a bias electrode disposed proximate to and beneath a substrate support surface disposed in the vacuum chamber to support a substrate to be biased during processing;
   a first RF source for providing a first radio frequency (RF) signal at a first frequency that is inductively coupled to the vacuum chamber via the inductive antenna;
   a second RF source for providing a second RF signal at the first frequency to the bias electrode; and
   a phase delay controller to control the phase delay between the first RF source and the second RF source,
   wherein the first and second RF sources are configured in a master-slave arrangement having a common exciter link coupling the first and second RF sources to provide a trigger signal from a master RF source to a slave RF source, wherein the phase delay controller comprises a switched lumped element delay line having a plurality of lumped delay lines coupled together in series, and wherein the phase delay controller controls a delay time of the trigger signal between the first and second RF sources.

2. The plasma reactor of claim 1, wherein the switched lumped element delay line comprises a rotary-switch based decade delay line.

3. The plasma reactor of claim 1, wherein the switched lumped element delay line comprises a toggle-switch based delay line.

4. The plasma reactor of claim 1, wherein the delay time is adjusted by an electronic programmable delay.

5. The plasma reactor of claim 1, further comprising:
   a phase detector coupled to respective outputs of the first and second RF sources to obtain signals from the first and second RF sources to determine relative phase.

6. The plasma reactor of claim 5, wherein the phase detector is a bridge rectifier.

7. The plasma reactor of claim 5, wherein the phase detector is an oscilloscope.

8. The plasma reactor of claim 5, wherein the phase detector is a zero-crossing circuit.

9. The plasma reactor of claim 5, wherein an output of the phase detector is coupled to the phase delay controller to provide adjustment to achieve a predetermined phase.

10. The plasma reactor of claim 1, further comprising:
    a controller configured to control the phase delay.

11. The plasma reactor of claim 10, wherein the controller is configured to control the phase delay as part of a recipe for a particular process to be performed in the plasma reactor.

12. A plasma etching reactor having an adjustable RF source phase delay, comprising:
    a vacuum chamber having an inductive antenna disposed proximate a ceiling of the vacuum chamber and a bias electrode disposed proximate to and beneath a substrate support surface disposed in the vacuum chamber to support a substrate to be biased during processing;

a first RF source for providing a first radio frequency (RF) signal at a first frequency that is inductively coupled to the vacuum chamber via the inductive antenna;

a second RF source for providing a second RF signal at the first frequency to the bias electrode and coupled to the first RF source via a common exciter link;

a phase delay controller to control the phase delay between the first RF source and the second RF source; and a controller to control the operation of components of the plasma etching reactor, wherein the first and second RF sources are configured in a master-slave arrangement to provide a trigger signal from a master RF source to a slave RF source via the common exciter link, wherein the phase delay controller comprises a switched lumped element delay line having a plurality of lumped delay lines coupled together in series, and wherein the phase delay controller controls a delay time of the trigger signal between the first and second RF sources.

13. The plasma etching reactor of claim 12, wherein the controller is further configured to control the phase delay as part of a recipe for a particular process to be performed in the plasma etching reactor.

14. The plasma reactor of claim 1, wherein the first RF source is directly connected to the second RF source via the common exciter link and the phase delay controller is disposed within the second RF source.

* * * * *